US006535088B1

(12) United States Patent
Sherman et al.

(10) Patent No.: US 6,535,088 B1
(45) Date of Patent: *Mar. 18, 2003

(54) SUSPENDED TRANSMISSION LINE AND METHOD

(75) Inventors: James R. Sherman, Seminole, FL (US); Ray B. Jones, Seminole, FL (US); Barry B. Pruett, Treasure Island, FL (US)

(73) Assignee: Raytheon Company, Lexington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/548,691

(22) Filed: Apr. 13, 2000

(51) Int. Cl.⁷ .................................................. H01P 3/08
(52) U.S. Cl. ........................................ 333/238; 333/246
(58) Field of Search .............................. 333/238, 246, 333/116, 128, 161, 204

(56) References Cited

U.S. PATENT DOCUMENTS

| 3,320,556 A | * | 5/1967 | Schneider ................... 333/34 |
| 3,419,813 A | * | 12/1968 | Kamnitsis ................... 333/295 |
| 4,214,217 A | | 7/1980 | Saito et al. ................... 334/45 |
| 4,254,386 A | | 3/1981 | Nemit et al. ................. 333/128 |
| 4,310,814 A | | 1/1982 | Bowman ..................... 333/121 |
| 4,394,633 A | | 7/1983 | Klein .......................... 333/238 |
| 4,614,922 A | | 9/1986 | Bauman et al. ............. 333/161 |
| 4,647,880 A | | 3/1987 | Argaman ..................... 333/164 |
| 4,772,864 A | | 9/1988 | Otto et al. ................... 333/238 |
| 4,916,457 A | | 4/1990 | Foy et al. .................... 343/770 |
| 4,945,319 A | * | 7/1990 | Wilson ......................... 333/33 |
| 4,958,165 A | | 9/1990 | Axford et al. ............... 343/770 |
| 4,987,377 A | | 1/1991 | Gray et al. .................... 330/54 |
| 5,021,755 A | | 6/1991 | Gustafson ................... 333/128 |
| 5,030,935 A | | 7/1991 | Williams et al. ............. 333/246 |
| 5,187,490 A | | 2/1993 | Ohta et al. ................... 343/770 |
| 5,200,719 A | | 4/1993 | Margulis et al. .............. 333/34 |
| 5,293,175 A | * | 3/1994 | Hemmie et al. ............. 343/795 |
| 5,444,453 A | * | 8/1995 | Lalezari ..................... 343/700 MS |
| 5,471,181 A | | 11/1995 | Park ............................. 333/246 |
| 5,581,266 A | | 12/1996 | Peng et al. ................... 343/770 |
| 5,712,607 A | * | 1/1998 | Dittmer et al. .............. 333/238 |
| 5,760,744 A | | 6/1998 | Sauer .................... 343/700 MS |
| 5,767,808 A | * | 6/1998 | Robbins et al. ...... 349/700 MS |
| 5,789,997 A | | 8/1998 | Dekker ........................ 333/127 |
| 5,872,545 A | | 2/1999 | Rammos ..................... 343/770 |
| 5,914,695 A | | 6/1999 | Liu et al. ..................... 343/795 |
| 5,946,794 A | | 9/1999 | Koizumi et al. .............. 29/600 |
| 6,081,988 A | | 7/2000 | Pluymers et al. ............. 29/601 |
| 2002/0044098 A1 | | 4/2002 | Von Stein et al. ........... 343/770 |

FOREIGN PATENT DOCUMENTS

| EP | 0 317 414 A1 | 5/1989 | .......... H01Q/21/24 |
| EP | 0 508 662 A2 | 10/1992 | ............ H01P/5/12 |
| EP | 0 801 433 A1 | 10/1997 | ............ H01P/3/08 |
| JP | 63281502 | 11/1988 | ............ H01P/5/08 |

OTHER PUBLICATIONS

Peter, R., et al, "High–Performance HEMT Amplifiers with a Simple Low–Loss Matching Network," IEEE Transactions on Microwave Theory and Techniques, vol. 39, Sep. 1, 1991, No. 9, New York, US, pp. 1673–1675.
PCT International Search Report Dated Aug. 6, 2001 for PCT/US01/11277 Filed Apr. 6, 2001.

(List continued on next page.)

Primary Examiner—Robert Pascal
Assistant Examiner—Dean Takaoka
(74) Attorney, Agent, or Firm—Baker Botts L.L.P.

(57) ABSTRACT

A suspended transmission line includes a lossy dielectric support layer having a first side and a second side. A conductor is supported between first and second ground planes by the lossy support layer and includes a first part supported on the first side of the lossy support layer and a second part supported on the second side of the lossy support layer. A propagation structure is positioned between the ground planes to substantially contain an electromagnetic field generated by a signal transmitted on the conductor.

15 Claims, 2 Drawing Sheets

OTHER PUBLICATIONS

Mosko, United States Statutory Invention Registration H27, "Integrable Broadside Power Divider," filed Sep. 3, 1985, published Feb. 4, 1986.

M. Saito, et al, XP–002172854, "UHF TV Tuner Using PC Board with Suspended Striplines," IEEE Transactions on Consumer Electronics, vol. CE–24, No. 4, Nov. 1978, pp. 553–559.

PCT International Search Report dated Aug. 6, 2001 for PCT/US01/11410 filed Apr. 6, 2001.

Pozar, D.M., *Microwave Engineering,* John Wiley & Sons, Inc., Second Edition, pp. 363–368, 1998.

Wilkinson, E.J., "An N–Way Hybrid Power Divider," IRE Transactions on Microwave Theory and Techniques, vol. MTT–8, No. 1, pp. 116–118, Jan., 1960.

Saleh, A.A.M., "Planar Electrically Symmetric *n*–Way Hybrid Power Dividers/Combiners," IEEE Transactions on Microwave Theory and Techniques, vol. MTT–28, No. 6, pp. 555–563, Jun., 1980.

Green, H.E., "The Numerical Solution of Some Important Transmission–Line Problems," IEEE Transactions on Microwave Theory and Techniques, vol. MTT–13, No. 5, pp. 676–692, Sep., 1965.

Fromm, W.E., "Characteristics and Some Applications of Stripline Components," IEEE Transactions on Microwave Theory and Techniques, vol. MTT–3, No. 2, pp. 13–19, Mar., 1955.

Saleh, A.A.M., Computation of the Frequency Response of a Class of Symmetric N–Way Power Dividers, Bell System Technical Journal, vol. 59, No. 8, pp. 1493–1512, Oct., 1980.

PCT US01/11410 to Raytheon Company, publication date Oct. 25, 2001.

* cited by examiner

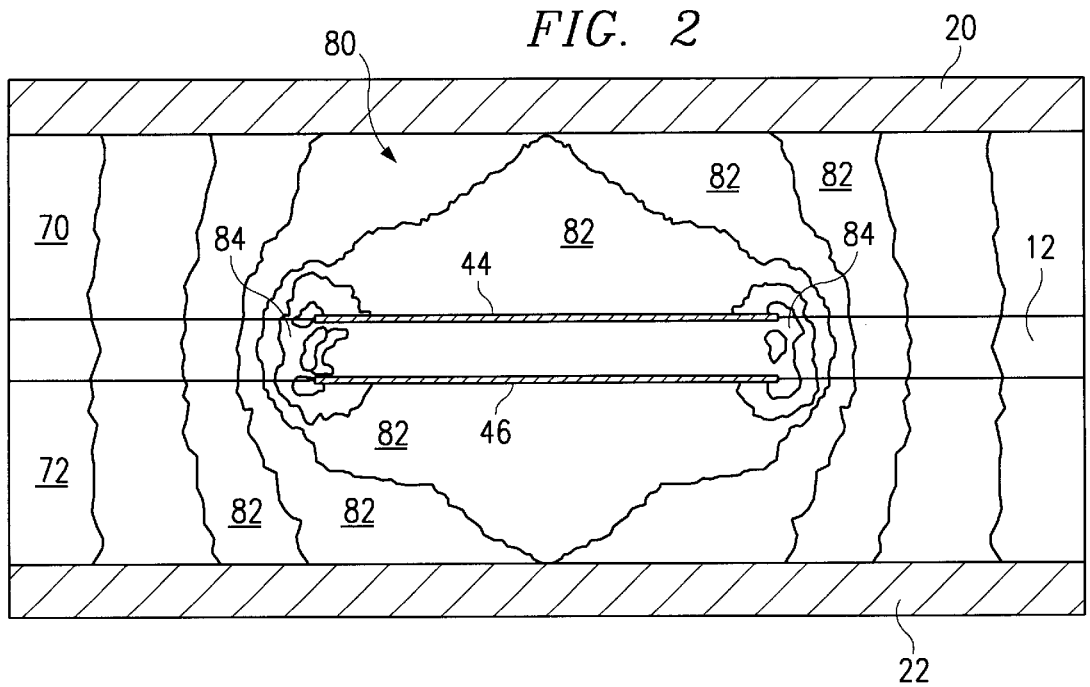
*FIG. 2*
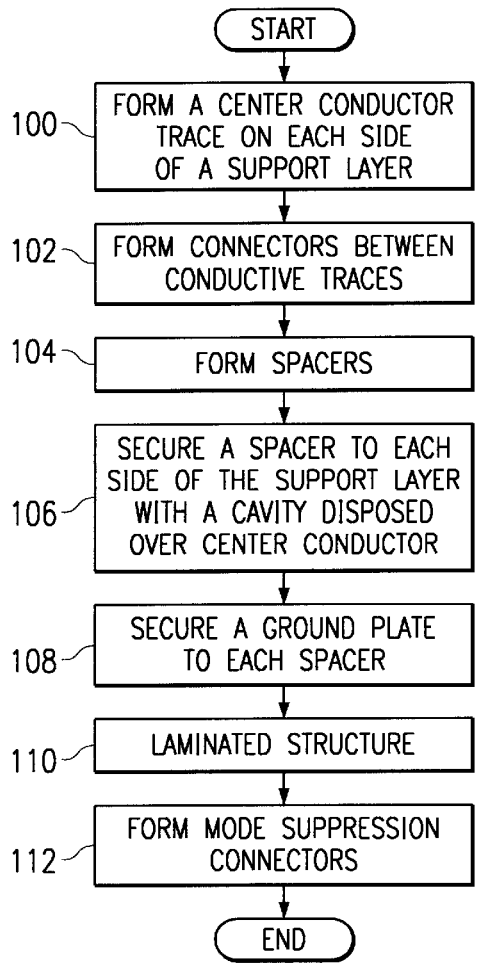
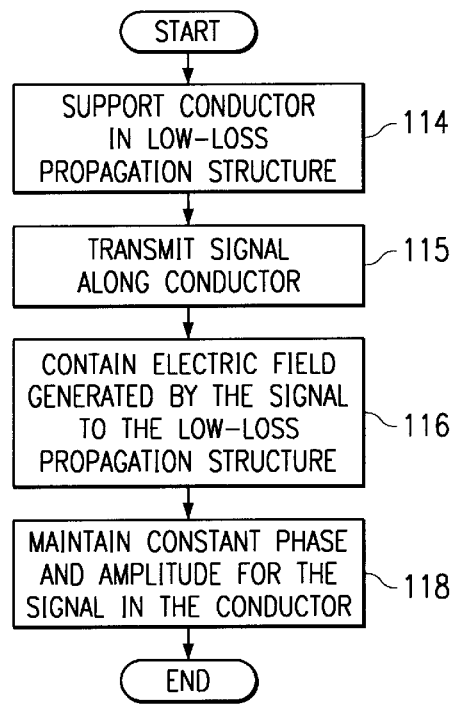

SUSPENDED TRANSMISSION LINE AND METHOD

RELATED APPLICATIONS

This application is related to U.S. patent application Ser. No. 09/548,686 entitled "Suspended Transmission Line with Embedded Signal Channeling Device", U.S. patent application Ser. No. 09/548,467 entitled "Suspended Transmission Line with Embedded Amplifier", U.S. patent application Ser. No. 09/548,578 entitled "Integrated Broadside Conductor for Suspended Transmission Line and Method", and U.S. application Ser. No. 09/548,689 entitled "Method for Fabricating Suspended Transmission Line", all filed on Apr. 13, 2000.

TECHNICAL FIELD OF THE INVENTION

This invention relates generally to the field of signal transmission systems, and more particularly to a suspended transmission line and method.

BACKGROUND OF THE INVENTION

Microwave and radio frequency circuits are generally implemented by interconnecting amplifiers, antennas, transistors, receivers, and other components by a series of transmission lines. The transmission lines propagate microwave and radio frequency energy between the components of the circuit.

Initially, transmission lines were implemented using a waveguide approach that provided superior electrical performance. In this implementation, transmission lines are basically shielded pipes in which microwave and radio frequency energy is propagated. Waveguide pipes are often impractical, however, because they are difficult to install and their size and weight is excessive for many applications.

During the 1950's, striplines were described by W. E. Fromm as practical high performance transmission line structures. These structures included a twin dielectric bead stripline, a thin dielectric sheet single metal clad stripline, and a thin dielectric sheet double metal clad stripline. In each stripline, a conductor was supported between metal ground plates and had an impedance based on its spacing from the ground plates.

The twin dielectric bead stripline includes two metal ground plates sandwiching a metal strip supported by two dielectric beads. One dielectric bead is disposed above the metal strip and one dielectric bead is disposed below the metal strip. The dielectric beads form a mechanical support to maintain impedance-dependent spacing between the ground plates and the metal strip while providing good signal propagation characteristics, such as low loss tangent and low relative permittivity.

The thin dielectric sheet single metal clad stripline includes a metal strip mounted on a thin dielectric sheet. Support posts suspend the thin dielectric sheet in the air between two metal ground plates and maintain impedance-dependent spacing of the metal strip from the ground plates. The support posts are placed away from the metal strip to reduce electromagnetic interaction between the metal strip and the support post. The disadvantage to this approach is that the metal strip is adjacent to the dielectric, where loss tangent increases transmission loss.

The thin dielectric sheet double metal clad stripline includes two metal strips with one mounted on each side of a thin dielectric sheet. As in the single metal clad stripline, the thin dielectric sheet is supported between two metal ground plates by support posts which maintain the impedance-dependent spacing between the metal strips and the ground plates. The two metal strips are connected in parallel at the input and output of the circuit. Electric fields exist from each strip to its corresponding ground plane and only fringing fields exist in the dielectric sheet.

The striplines use low-loss material for the thin dielectric sheets in order to provide low dissipation loss and high performance operation. A problem with the striplines is the expense of low-loss dielectric material at microwave and radio frequencies. Exotic materials such as Alumina, Duroid (Teflon-glass), cross-linked polystyrene (Rexolite), and Beryllium Oxide (BeO) are used. These materials are extremely expensive and lead to high transmission line costs. In addition, specialized fabrication procedures are often necessary for the exotic materials which further increases transmission line cost.

SUMMARY OF THE INVENTION

The present invention provides a suspended transmission line and method that substantially eliminates or reduce the disadvantages and problems associated with previous systems and methods. In particular, the present invention provides a low cost and high performance suspended transmission line for microwave and radio frequency applications.

In accordance with one embodiment of the present invention, a suspended transmission line includes a low cost lossy dielectric support layer having a first side and a second side. A conductor is supported between first and second ground planes by the lossy support layer and includes a first part supported on the first side of the lossy support layer and a second part supported on the second side of the lossy support layer. A propagation structure is positioned between the ground planes to substantially contain an electric field generated by a signal transmitted on the conductor.

More specifically, in accordance with a particular embodiment of the present invention, the first and second parts of the conductor substantially mirror each other. In this and other embodiments, the propagation structure may include a first air cavity and a second air cavity. A first ground plate is displaced from the first side of the lossy support layer and includes the first ground plane. A first spacer is disposed between the lossy support layer and the first ground plate to form the first air cavity over the first part of the conductor. A second ground plate is displaced from the second side of the lossy support layer and includes the second ground plane. A second spacer is disposed between the lossy support layer and the second ground plate to form the second air cavity over the second part of the conductor.

Technical advantages of the present invention include providing an improved transmission line for microwave and radio frequency applications. In particular, lossy or other inexpensive dielectric material is used to support a center conductor that directs electric fields into a low-loss propagation structure. As a result, a high performance and high power transmission line may be produced at relatively low cost.

Another technical advantage of the present invention includes allowing integration of components into a suspended transmission line structure. In particular, components may be inserted into the suspended transmission line through access holes and directly connected to the center conductor to form circuit devices. Accordingly, separate modules and housings are not required for the devices. In addition, separate layers may be used for digital and direct current power transmission and multiple layers may be vertically integrated. This allows efficient and cost effective construction of transmission systems.

Other technical advantages of the present invention will be readily apparent to one skilled in the art from the following figures, description, and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, in which:

FIG. 2 is a sectional diagram illustrating distribution of an electric field in the suspended transmission line of FIG. 1;

FIG. 3 is a flow diagram illustrating a method for fabricating the suspended transmission line of FIG. 1 in accordance with one embodiment of the present invention; and FIG. 4 is a flow diagram illustrating a method for transmitting a signal in the transmission line of FIG. 1 in accordance with one embodiment of the present invention.

DETAILED DESCRIPTION OF THE INVENTION

Figure 1:
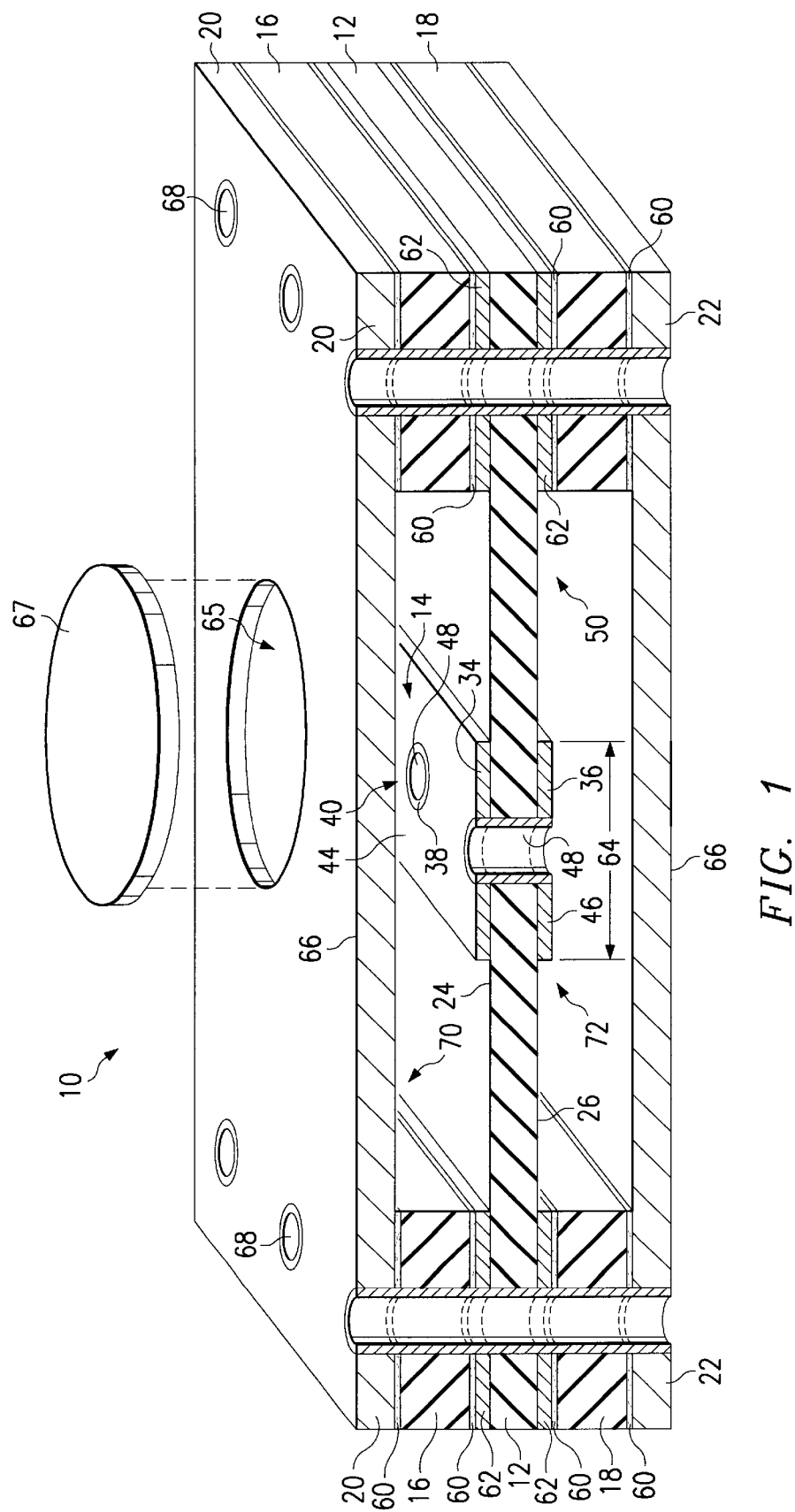
FIG. 1 is a sectional diagram illustrating a suspended transmission line in accordance with one embodiment of the present invention.

FIG. 1 illustrates a suspended transmission line 10 in accordance with one embodiment of the present invention.

In this embodiment, the suspended transmission line 10 is used to transmit microwave and other radio frequency signals in a transmission system. As described in more detail below, an amplifier, power divider, or other active or passive device may be embedded into the transmission line 10 to manipulate a transmitted signal. The transmitted signal may be an outgoing signal being transmitted to an antenna or an incoming signal being received from an antenna. It will be understood that the suspended transmission line 10 may be otherwise suitably configured for use in microwave, radio frequency and other suitable high power or other applications.

Referring to FIG. 1, the suspended transmission line 10 includes a support layer 12 supporting a center conductor 14, first and second spacers 16 and 18 each disposed on opposite sides of the support layer 12, and first and second plates 20 and 22 each disposed outwardly of a corresponding spacer 16 or 18. As described in more detail below, each of the layers 12, 16, 18, 20, and 22 may be separately fabricated and thereafter laminated together to form the suspended transmission line 10.

The support layer 12 is a thin dielectric sheet having a first side 24 and an opposite second side 26. The thickness of the support layer 12 is preferably minimized to a thickness needed to support the center conductor 14 in order to minimize the cross section of the support layer 12 and thus limit electrical fields in the layer 12. The support layer 12 may be continuous or include openings (not shown) to control propagation characteristics of the suspended transmission line 10, to allow integration of components directly into the suspended transmission line 10, and the like.

The support layer 12 is fabricated from a lossy or other inexpensive dielectric material. The use of a lossy dielectric material for the support layer 12 avoids the necessity of exotic low-loss materials such as Alumina, Duroid, cross-linked polystyrene, and Beryllium Oxide previously used to support a conductor in a suspended transmission line. Although such low-loss materials improve performance, such materials are typically very expensive. A lossy material is the material of preference because, as described in more detail below, the center conductor 14 is configured to direct an electric field generated by a signal on the center conductor 14 substantially away from the support layer 12 such that only fringing electrical fields cross the support layer 12. Dissipation losses due to the fringing electrical fields are minimal even in the lossy material of the support layer 12. As a result, the suspended transmission line 10 may be produced at relatively low cost and used in high power and high performance applications.

The lossy material of the support layer 12 is an epoxy glass such as G-10 or GFG, polyimide glass, or other suitable printed circuit board base materials such as polyester, or other suitable lossy materials. A lossy material has a moderate loss tangent of about 0.04 or less.

In one embodiment, G-10 material is preferred for the support layer 12 because G-10 has good dimensional stability over a large temperature range and is easy to laminate and match to other layers and materials. In another embodiment, an incremental increase in performance is obtained by using low loss PTFE material in place of the G-10 for the support layer 12. Because the support layer 12 is thin, this results in only a small increase in cost.

The center conductor 14 is supported by the support layer 12 between the first and second plates 20 and 22. The first and second plates 20 and 22 provide the upper and lower plates and act as ground planes to the suspended transmission line 10. Plates 20 and 22 may be solid metal or a base substrate material with metal layers on both sides. The center conductor 14 transmits the signal with low dissipation loss. Accordingly, the suspended transmission line 10 has utility to carry a signal over long distances between amplifiers, antennas, transmitters, receivers, and other components in the transmission or receiver system.

The center conductor 14 includes a first part 34 exposed at the first side 24 of the support layer and a second part 36 exposed at the second side 26 of the support layer 12. The first and second parts 34 and 36 of the center conductor 14 preferably mirror each other to minimize in the support layer 12 the electric field generated by a signal transmitted on the center conductor 14.

A third part 38 of the center conductor 14 connects the first and second parts 34 and 36 at intermediate points 40 along the length of the center conductor 14. Connection of the first and second parts 34 and 36 at the intermediate points 40 produces equal phase and amplitude for a signal between the first and second parts 34 and 36 and reduces electric field coupling. As a result of this structure, the electric field generated by a transmitted signal is substantially directed away from the support layer 12 with only fringing electric fields in the support layer 12. Further details of a typical electric field distribution are described below in connection with FIG. 2.

Connection of the first and second parts 34 and 36 of the center conductor 14 at the intermediate points 40 means the first and second parts 34 and 36 are electrically connected to each other at least at spaced intervals along the length of the center conductor 14. Spacing between the intermediate points 40 is substantially equal along the length of the center conductor 14 and is based on the frequency of the signal to be transmitted by the suspended transmission line 10. In a particular embodiment, the center conductor 14 includes about 10 to 20 connections per wavelength of the transmitted signal frequency. It will be understood that other suitable spacing that maintains a substantially constant phase and amplitude for a signal on the center conductor 14 may be used.

In the illustrated embodiment, the center conductor 14 is an integrated broadside conductor. For this embodiment, the first part 34 of the center conductor 14 is a first conductive strip 44 disposed on the first side 24 of the support layer and the second part 36 of the center conductor 14 is a second conductive strip 46 disposed on the second side 26 of the support layer 12. The first and second conductive strips 44 and 46 are silver-plated copper or other suitable metal traces that minimize conductor resistivity. The third part 38 of the center conductor 14 comprises a plurality of broadside connectors 48 each extending through the support layer 12 between the first and second conductive strips 44 and 46 to electrically couple the strips 44 and 46 at an intermediate point 40. Unless otherwise specified, the use of the term each herein means each of at least a subset of the identified items. The connectors 48 are copper or silver plated copper vias or other suitable conductive connectors.

The first and second spacers 16 and 18 maintain the plates 20 and 22 in space relation with the support layer 12, and thus the center conductor 14, to form a propagation structure 50 encompassing the center conductor 14 with air and ground planes for Quasi-TEM mode of propagation. The propagation structure 50 encompasses the center conductor 14 in that it is over, including above and/or below the conductor 14 up to and not beyond the upper and lower ground plates 20 and 22. As described in more detail below, the propagation structure 50 provides a low-loss medium for propagation of the electromagnetic field generated by a transmitted signal. Accordingly, dissipation losses are minimized along the suspended transmission line 10.

The first and second spacers 16 and 18 may each be continuous along the propagation structure 50 or comprise a plurality of discrete posts or other suitable structures operable to maintain the plates 20 and 22 in space relation from the center conductor 14. The spacers 16 and 18 are sized such that substantially all of the electromagnetic field generated by a transmitted signal on the center conductor 14 is maintained in the propagation structure 50. Thus, as described in more detail below, spacer geometry is dependent on the transmitted signal frequency as well as the size, geometry, and materials of the support layer 12, center conductor 14, plates 20 and 22, and propagation structure 50.

The first and second spacers 16 and 18 are each fabricated of a dielectric, conductor, or other suitable material or materials. Preferably, the sidewalls of the spacers 16 and 18 are spaced apart and away from the center conductor 14 to minimize the effect on the electromagnetic field in the propagation structure 50. This minimizes the changes in impedance along the direction of propagation. In addition, the spacer material preferably has a coefficient of thermal expansion equal or at least similar to the material of the support layer 12 so that the suspended transmission line 10 has good mechanical stability over a large temperature range. In a particular embodiment, the support layer 12 and spacers 16 and 18 are each fabricated of G-10 material.

For the illustrated embodiment, each spacer 16 and 18 includes adhesion layers 60 at each edge for connecting the spacers to the support layer 12 and the plates 20 and 22. The support layer 12 includes a metalization layer 62 on each side 24 and 26. The metalization layers 62 form the point of attachment of the mode suppression connection vias 68. These minimize the impedance altering effects of the potential higher order modes and reduce electromagnetic coupling between alternate board routes. In this embodiment, the first spacer 16 is attached to the metalization layer 62 on the first side 24 of the support layer 12 to separate the first plate 20 from the center conductor 14. The second spacer 18 is attached to the metalization layer 62 on the second side 26 of the support layer 12 to separate the second plate 22 from the center conductor 14. Both layers 62 on 24 and 26 are attached to the connection vias 68.

The first and second plates 20 and 22 may consist entirely of conductive metal such as copper or may consist of a lossy dielectric with copper or silver-plated copper or other suitable metal with low resistivity on each side. These plates form the ground plane 66 disposed over the center conductor 14. The ground planes 66 of the plates 20 and 22 and the underlying conductive strips 44 and 46 of the center conductor 14 together generate the electromagnetic field in the propagation structure 50. Variations in spacing of the ground plane 66 from the center conductor 14 may be offset by the line width 64 of the center conductor 14 in order to maintain a substantially constant impedance in the center conductor 14. Spacing variations may be caused by access openings 65 cut in the ground plane 66 to allow insertion and integration of a device into the suspended transmission line 10. In this case, the access opening is illustrated covered by a magnetic or other ground cover 67 secured flush with the outside of the plate 20 or 22.

In the illustrated embodiment, the plates 20 and 22 comprise a conductive material and each form a continuous ground plane 66. In a particular embodiment, the plates 20 and 22 are copper plates having a thin outer tin layer (not shown) to reduce corrosion and improve solderability. The first plate 20 is attached outwardly of the first spacer 16 to form a first propagation cavity 70 between the first plate 20 and the first conductive strip 44 of the center conductor 14. The second plate 22 is attached outwardly of the second spacer 18 to form a second propagation cavity 72 between the second plate 22 and the second conductive strip 46 of the center conductor 14. In this embodiment, the first and second propagation cavities 70 and 72 form the propagation structure 50.

The propagation cavities 70 and 72 each provide a low-loss medium for propagation of the electromagnetic field generated by a transmitted signal on the center conductor 14. The low-loss medium is a medium that propagates the electromagnetic field with a dissipation loss on the order of about 0.1 dB/inch or below at microwave frequencies. In the illustrated embodiment, the propagation cavities 70 and 72 are each an air cavity. To prevent moisture from entering the suspended transmission line 10, the propagation cavities 70 and 72 may include closed cell foam or other suitable low-loss material to displace the air and reduce overall moisture content.

A plurality of mode suppression connectors 68 are formed on either side of the propagation structure 50 to eliminate or reduce interference between the suspended transmission line 10 and nearby or adjacent transmission lines and other devices or circuits in the transmission system. The mode suppression connectors 68 are spaced in accordance with conventional techniques. In one embodiment, the mode suppression connectors 68 are tin plated copper vias extending through the support layer 12 and spacers 16 and 18 between the plates 20 and 22. The mode suppression connectors 68 are attached to the metalization layers 62 for additional mechanical support and improved mode suppression.

For the suspended transmission line 10, the geometry, size, and material of the support, spacer, and plate layers 12, 16, 18, 20 and 22 and of the center conductor 14 and propagation cavities 70 and 72 are dependent on the frequency of a signal to be transmitted by the line 10. The relationship between the transmitted signal frequency and the materials and geometry of the suspended transmission line 10 dictate that the transmission line 10 should be operated below the first cut-off frequency of the potential higher order modes. The onset of the first higher order mode may be approximated by frequency equations for rectangular waveguide and for non-integrated suspended stripline. The frequency equation for rectangular waveguide is as follows:

$$f_c = \frac{c0}{2 \cdot a}$$

where: $f_c$=TE10 mode cut-off frequency
c0=the speed of light in a vacuum
a=the enclosure (waveguide) width The frequency equation for non-integrated suspended striplines is as follows:

$$f_c = \frac{c0}{2 \cdot a}\sqrt{1 - \frac{h}{b}\left[\frac{e_r - 1}{e_r}\right]}$$

where: $f_c$=1st higher order mode cut-off frequency
c0=the speed of light in vacuum
a=the enclosure width
b=the enclosure height
h=the supporting substrate height
$e_r$=the relative dielectric constant of the dielectric support layer These equations provide a close estimation of values for the suspended transmission line 10, with the non-integrated suspended stripline equation generally providing a closer approximation due to the low cut-off frequency of the suspended transmission line 10. Other factors have been known to change the cut-off frequency of the suspended transmission line 10. Such factors include the size and spacing of the mode suppression connectors 68 and the size and spacing of the broadside connectors 48.

In one embodiment, values obtained for a particular implementation of the suspended transmission line 10 from the equations may be fine tuned using conventional computer simulation techniques and programs, modified to account for the configuration of the suspended transmission line 10. Suitable programs include ANSOFT EXTRACTOR for 2-D analysis and ANSOFT HFSS (High Frequency Structure Simulator) for 3-D analysis. Further modeling may be done using the BRCTL mode of the HP MDS LINECALC model. The LINECALC mode is normally used for a pair of coupled lines as opposed to a single transmission line with mode voltages identical at any cross-section. In the BRCTL model, even mode characteristic impedance is used as twice the characteristic impedance of the suspended transmission line 10 to account for the dual parallel configuration of the center conductor 14. In addition, because the space between the first and second conductive strips 44 and 46 has nearly the same potential as the first and second conductive strips 44 and 46 when they are held at the same potential by the connectors 48, the first and second conductive strips 44 and 46 can be regarded as a single thick conductor. Accordingly, the thickness of the conductive strips 44 and 46 must be accounted for in impedance calculations. Other modes of the MDS LINECALC model, finite element analysis, and other suitable techniques are available to simulate and design the suspended transmission line 10.

In a particular microwave embodiment of the suspended transmission line 10, the support layer 12 comprises G-10 material having a relative dielectric constant of 4.5 and a thickness of 8 mils. In this particular embodiment, the first and second spacers 16 and 18 each comprise G-10 material and with the adhesion layers 60 having a thickness of 38 mils. The plates 20 and 22 are each copper and have a thickness of 20 mils. Each propagation cavity 70 and 72 has an enclosure width of 240 mils and an enclosure height of 38 mils. The center conductor 14 has an impedance of 50 ohms and comprises of copper plated silver traces 44 and 46 on each side 24 and 26 of the support layer and plated silver connectors 48 extending through the support layer 12 between the silver-plated traces 44 and 46. The silver plated traces 44 and 46 each have a thickness of 1.5 mils and a line width of 20 mils. The connectors 48 have a diameter of 13 mils and are each spaced approximately 100 mils apart. The suspended transmission line 10 of this embodiment has a cut off frequency of 14.2 GHz and an upper useful range of about 14 GHz, which provides a margin to account for manufacturing tolerances. Testing of this suspended transmission line 10 showed an insertion loss of 0.02 dB per inch at 1 GHz, an insertion loss is 0.05 dB per inch at 5 GHz, an insertion loss of 0.12 dB per inch at 10 GHz, and an insertion loss of 0.55 dB per inch at 15 GHz.

FIG. 2 illustrates distribution of an electric field 80 in the suspended transmission line 10. As previously described, the electric field 80 is generated by a propagating electromagnetic signal around the center conductor 14. This signal may be a microwave, radio, or other suitable frequency signal.

Referring to FIG. 2, the electric field 80 includes a transverse field 82 generally perpendicular to the conductive strips 44 and 46 and small fringing fields 84 in the support layer 12 at the edges of the conductive strips 44 and 46. The transverse field 82 comprises the significant part of the electric field 80 and is propagated in the low-loss medium of the propagation cavities 70 and 72. Accordingly, dissipation or insertion losses are minimal and limited to losses in the fringing field 84.

FIG. 3 is a flow diagram illustrating a method for fabricating the suspended transmission line 10 of FIG. 1 in accordance with one embodiment of the present invention. In this embodiment, the support, spacer, and ground layers 12, 16, 18, 20, and 22 are separately fabricated and thereafter laminated together to form the suspended transmission line 10. It will be understood that the suspended transmission line 10 may be otherwise fabricated and comprise other materials without departing from the scope of the present invention.

Referring to FIG. 3, the method begins at step 100 in which the conductive traces 44 and 46 are formed on each side 24 and 26 of the support layer 12. In one embodiment, copper on support layer 12 is patterned and etched to form the conductive traces 44 and 46. The silver is plated on the resultant copper traces. In this embodiment, the silver plating may be applied outside or at the edges of the cavities 70 and 72 to form the metalization layers 62 and provide an intermediate ground plane on each side 24 and 26 of the support layer 12. The support layer 12 is cut to size before or after formation of the conductive traces 44 and 46.

Proceeding to step 102, connectors 48 are formed in the support layer 12 between the first and second conductive strips 44 and 46. In one embodiment, the connectors 48 are formed by drilling vias at the intermediate points 40 along the conductive strips 44 and 46 and plating the vias with copper. These vias are then silver plated. As previously described, the connectors 48 provide equal phase and amplitude for a signal between the first and second conductive strips 44 and 46 to reduce electric field coupling. The reduced electric field coupling between conductive strips 44 and 46 lead to reduced insertion loss.

Next, at step 104, the first and second spacers 16 and 18 are each formed by a pair of opposing strips routed or otherwise formed from a spacer layer. The spacer layer preferably comprises an inexpensive material that is thermally matched to the support layer 12.

At step 106, the spacers 16 and 18 are each laminated to opposite sides 24 and 26 of the support layer 12. The strips for each spacer are positioned along edges of the support layer 12 and displaced from the center conductor 14 to form the propagation cavities 70 and 72. In one embodiment, the spacers 16 and 18 are laminated to the support layer 12 using a conventional no-flow or low-flow B-stage process. In the B-stage process, partially cured epoxy with glass cloth reinforcement is attached to the support layer 12 and becomes part of overlying spacer 16 or 18. The geometry of the glass cloth reinforcement matches that of the overlying spacer 16 or 18 so as to not interfere with the cavity 70 or 72. The no-flow or low-flow characteristics of the partially cured epoxy prevents or minimizes epoxy flow into the cavities 70 or 72.

Proceeding to step 108, the ground plates 20 and 22 are each formed and attached to a spacer 16 or 18. In one embodiment, each ground plate 20 and 22 is laminated to the respective spacer 16 or 18 using the no-flow or low-flow B-stage process previously described in connection with step 106. The plates 20 and 22, in connection with the spacers 16 and 18 and the support layer 12, form the propagation cavities 70 and 72.

Next, at step 110, the laminated layers are pressed together and heated to cure the epoxy and form the basic structure of the suspended transmission line 10. For the low-flow B-stage process, the layers may be pressed together at a pressure of 250–300 psi and heated at a temperature of 350 degrees Fahrenheit for 90 minutes.

At step 112, the mode suppression connectors 68 are formed for the suspended transmission line 10. In one embodiment, the mode suppression connectors 68 are each formed by drilling a via through the plates 20 and 22, spacers 16 and 18, and support layer 12, and plating the vias with copper. In this embodiment, the vias preferably have a diameter greater than 0.04 inches to allow copper and tin plating through the entirety of the vias. In this way, the suspended transmission line 10 is efficiently fabricated further reducing transmission line cost. In addition, conventional multi-layer printed circuit board fabrication techniques may be used in fabrication of the suspended transmission line 10 eliminating the need for the development and testing of new techniques and equipment.

FIG. 4 illustrates a method for transmitting a signal in the suspended transmission line 10. The method begins at step 114 in which the conductor 114 is supported in the low-loss propagation structure 50. As previously described, the low-loss propagation structure includes air cavities 70 and 72 formed above and below the conductor 14.

Proceeding to Step 115, a signal is transmitted along the conductor 14. At step 116, an electric field generated by the signal is substantially contained to the low-loss propagation structure 50. In addition, at step 118, a substantially constant phase and amplitude for the signal is maintained in the conductor 14. Accordingly, line losses are minimized in the suspended transmission line 10.

Although the present invention has been described with several embodiments, various changes and modifications may be suggested to one skilled in the art. It is intended that the present invention encompass such changes and modifications as fall within the scope of the appended claims.

What is claimed is:

1. A suspended transmission line, comprising:
    a lossy dielectric support layer having a first side and a second side;
    a conductor supported by the lossy dielectric support layer, the conductor having a first part supported on the first side of the lossy support layer and a second part supported on the second side of the lossy support layer;
    a first ground plane positioned from the first side of the dielectric support layer in a spaced relationship, the spacing between the first ground plane and the first side selected to form a propagation structure to substantially contain the electromagnetic field generated by a transmitted signal on the conductor in the propagation structure;
    a second ground plane positioned from the second side of the dielectric support layer in a spaced relationship, the spacing between the second ground plane and the second side selected to form a propagation structure to substantially contain the electromagnetic field generated by a transmitted signal on the conductor in the propagation structure; and
    a plurality of broadside connectors spaced at substantially equal distances along the conductor, the spacing based on the transmitted signal frequency to maintain a substantially constant phase and amplitude for the transmitted signal on the conductor to reduce electric field coupling through the support layer, the plurality of broadside connectors connecting the first and second parts along the length of the conductor.

2. The suspended transmission line of claim 1, wherein the lossy support layer comprises an epoxy glass material.

3. The suspended transmission line of claim 1, wherein the lossy support layer comprises G-10 material.

4. The suspended transmission line of claim 1, wherein the first part of the conductor comprises a first conductive strip supported on the first side of the lossy support layer and the second part of the conductor comprises a second conductive strip supported on the second side of the lossy support layer.

5. The suspended transmission line of claim 4, wherein the first and second conductive strips comprise plated metal traces.

6. The suspended transmission line of claim 1, wherein the first and second parts of the conductor substantially mirror each other.

7. The suspended transmission line of claim 1, wherein the propagation structure comprises a first air cavity over the first part of the conductor and a second air cavity over a second part of the conductor.

8. The suspended transmission line of claim 7, further comprising:
    a first ground plate displaced from the first side of the lossy support layer and including the first ground plane;
    a first spacer between the lossy support layer and the first ground plate to form the first air cavity over the first part of the conductor;
    a second ground plate displaced from the second side of the lossy support layer and including the second ground plane; and
    a second spacer between the lossy support layer and the second ground plate to form the second air cavity over the second part of the conductor.

9. The suspended transmission line of claim 8, further comprising a plurality of mode suppression connectors connecting the first and second ground plates at spaced intervals.

10. The suspended transmission line of claim 9, wherein the mode suppression connectors each extend through the first and second spacers and the lossy support layer between the first and second ground plates.

11. A method for transmitting a signal at a specified frequency, comprising:

supporting a conductor on a lossy dielectric support layer in a low-loss propagation structure between opposing ground planes;

transmitting the signal along the conductor;

maintaining an electric field generated by the frequency of the transmitted signal at a substantially constant phase and amplitude along the conductor;

reducing electric field coupling through the dielectric support layer; and substantially containing an electric field generated by the transmitted signal to the low-loss propagation structure.

12. The method of claim 11, further comprising supporting the conductor on an epoxy glass support layer.

13. The method of claim 11, further comprising supporting the conductor on a G-10 material support layer.

14. The method of claim 11, wherein supporting the conductor on the lossy dielectric support layer comprises:

disposing a first conductive strip on a first side of the lossy support layer; and disposing a second conductive strip on a second side of the lossy support layer.

15. The method of claim 14, further comprising connecting the first and second conductive strips at spaced intervals along the length of the conductor to maintain the substantially constant phase and amplitude for the signal.

* * * * *